United States Patent [19]
Wang

[11] Patent Number: 6,044,116
[45] Date of Patent: *Mar. 28, 2000

[54] ERROR-FLOOR MITIGATED AND REPETITIVE TURBO CODING COMMUNICATION SYSTEM

[75] Inventor: Charles C. Wang, Arcadia, Calif.

[73] Assignee: The Aerospace Corporation, El Segundo, Calif.

[*] Notice: This patent is subject to a terminal disclaimer.

[21] Appl. No.: 09/182,446

[22] Filed: Oct. 29, 1998

[51] Int. Cl.[7] .............................. H04L 5/12; H03M 13/12
[52] U.S. Cl. ............................................ 375/265; 714/786
[58] Field of Search ..................................... 375/340, 341, 375/262, 265; 371/43.1, 44, 45, 46

[56] References Cited

U.S. PATENT DOCUMENTS

5,446,747  8/1995  Berrou ..................................... 375/340
5,721,745  2/1998  Hladik et al. ............................. 371/43

*Primary Examiner*—Temesghen Ghebretinsae
*Attorney, Agent, or Firm*—Derrick Michael Reid

[57] ABSTRACT

The turbo coding system combines: a) repetitive turbo encoder bit partitioning and decoder bit deletion; with b) error-floor mitigating encoder non-flushing the second constituent encoder with the second a-posteriori probability (APP) decoder starting backward recursion from any possible states as a powerful improvement to conventional turbo coding. The repetitive turbo encoding process repeats the bits of the systematic root sequence and appends flushing sequence prior to interleaving and encoding by the second constituent turbo encoder for providing an interleaved repetitive second encoded output for turbo decoding. The error-floor mitigating turbo encoding process does not flush the second constituent encoder to the zero ending state so that turbo decoding forward recursion may be end in any possible state and backward recursion may start from any possible state to avoid potential mismatches between the forward and backward recursions. The modified a posterior probability second decoder initializes the beginning state metric of the backward recursion with the ending state metric of the forward recursion. The two processes provide significant bit error rate improvement. Iterative decoding provides iterative results that are subject to majority voting selection for improved estimations of the decoded systematic data sequence.

3 Claims, 8 Drawing Sheets

REPETITIVE TURBO ENCODER

ERROR-FLOOR MITIGATING TURBO ENCODER

ERROR-FLOOR MITIGATING TURBO DECODER

FIG. 3

ERROR-FLOOR MITIGATING TURBO DECODING DATA STRUCTURE

FIG. 4

REPETITIVE TURBO ENCODER

$$(u_1^{(1)}, u_1^{(2)}, \ldots, u_1^{(r)}, u_2^{(1)}, u_2^{(2)}, \ldots, u_2^{(r)}, \ldots, u_N^{(1)}, u_N^{(2)}, \ldots, u_N^{(r)},$$
$$\underbrace{\phantom{u_1^{(1)}, u_1^{(2)}, \ldots, u_1^{(r)}}}_{\text{r-tuple}}$$

$$\underbrace{u_{rN+1}^*, \ldots, u_{rN+m}^*)}_{\text{m-tuple}}$$

$$e_1(ru);u^* =$$

$$(e_{11}^{(1)}, e_{11}^{(2)}, \ldots, e_{11}^{(r)}, e_{12}^{(1)}, e_{12}^{(2)}, \ldots, e_{12}^{(r)}, \ldots, e_{1N}^{(1)}, e_{1N}^{(2)}, \ldots,$$
$$\underbrace{\phantom{e_{11}^{(1)}, e_{11}^{(2)}, \ldots, e_{11}^{(r)}}}_{\text{r-tuple}}$$

$$\underbrace{e_{1N}^{(r)}, e_{1,rN+1}^*, \ldots, e_{1,rN+m}^*)}_{\text{m-tuple}} = F(\{u_j \mid j=1, \ldots, rN\})$$

$$e_2(ru;u^*) =$$

$$(e_{2,1}, e_{2,2}, \ldots, e_{2,rN}, \underbrace{e_{2,rN+1}^*, \ldots, e_{2,rN+m}^*}_{\text{m-tuple}}) = F(\text{interleaved } \{u_j \mid j=1, \ldots, rN\}|)$$

$$\{u_k, e_{1k}, e_{2k}\} =$$

$$(\ldots, \underbrace{u_k, e_{1k}^{(1)}, e_{1k}^{(2)}, \ldots, e_{1k}^{(r)}, e_{2,(k-1)r+1}, e_{2,(k-1)r+2}, \ldots, e_{2,(k-1)r+r}, \ldots,}_{N\ (2r+1)\text{-tuples}}$$

$$\underbrace{u_{rN+n}^*, e_{1,rN+n}^*, e_{2,rN+m}, \ldots}_{\text{m 3-tuples}})$$

REPETITIVE TURBO ENCODER DATA STRUCTURE

FIG. 6

REPETITIVE TURBO DECODER

$$(\underline{\ldots\ldots, x_k, y_{1k}^{(1)}, y_{1k}^{(2)}, \ldots, y_{1k}^{(r)}, y_{2,(k-1)r+1}, y_{2,(k-1)r+2}, \ldots, y_{2,(k-1)r+r},}$$
$$N\ (2r+1)\text{ - tuples}$$

$$\underline{\ldots, x_{rN+n}^{*}, y_{1,rN+n}^{*}, y_{2,rN+m}, \ldots})$$
$$m\ 3\text{-tuples}$$

$$\{X_k\} =$$

$$(\underline{x_1^{(1)}, x_1^{(2)}, \ldots, x_1^{(r)}, x_2^{(1)}, x_2^{(2)}, \ldots, x_2^{(r)}, \ldots\ldots, x_N^{(1)}, x_N^{(2)}, \ldots,}$$

$$x_N^{(r)}, \underline{x_{rN+1}^{*}, \ldots, x_{rN+m}^{*}})$$
$$m\text{-tuples}$$

$$\{Y_{1k}\} =$$

$$(\underline{y_{11}^{(1)}, y_{11}^{(2)}, \ldots, y_{11}^{(r)}, y_{12}^{(1)}, y_{12}^{(2)}, \ldots, y_{12}^{(r)}, \ldots\ldots, y_{1N}^{(1)},}$$
$$N\ r\text{-tuples}$$

$$y_{1N}^{(2)}, \ldots, y_{1N}^{(r)}, \underline{y_{1,rN+1}^{*}, \ldots, y_{1,rN+m}^{*}})$$
$$m\text{-tuple}$$

$$\{Y_{2k}\} =$$

$$(y_{2,1}, y_{2,2}, \ldots, y_{2,rN}, \underline{y_{2,rN+1}^{*}, \ldots, y_{2,rN+m}^{*}})$$
$$m\text{-tuple}$$

REPETITIVE TURBO DECODER DATA SRUCTURE

FIG. 8

ERROR-FLOOR MITIGATED AND REPETITIVE TURBO CODING COMMUNICATION SYSTEM

REFERENCE TO RELATED APPLICATION

The present application is related to applicant's application entitled "Error-Floor Mitigating Turbo Code Communication Method" Ser. No.: 09/182,447, filed Oct. 29, 1998, by the same inventor.

The present application is related to applicant's application entitled "Repetitive Turbo Coding Communication Method" Ser. No.: 09/182,445, filed Oct. 29, 1998, by the same inventor.

STATEMENT OF GOVERNMENT INTEREST

The invention was made with Government support under contract F04701-93-C-0094 by the Department of the Air Force. The U.S. Government has certain rights in the invention.

FIELD OF THE INVENTION

The invention relates to the field of channel encoding and decoding for the communication of data across a noisy channel. More particularly, the invention relates to turbo encoding and decoding methods and systems.

BACKGROUND OF THE INVENTION

Conventional Reed-Solomon and convolutional coding have been used together to correct both burst and random errors, respectively, in a continuous stream of convolved data bits. Conventional convolutional encoders use an interleaver to interleave code bits over a larger time period for translating uncorrectable burst errors into correctable random errors. However, in low bit energy to noise power spectral density Eb/No applications, conventional convolutional coding error correction often does not meet system required bit error rates (BER). One technique for improving error rates is to repeat the transmission of a channel bit several times. A bit is partitioned into several identical bits and transmitted. However, this bit partitioning disadvantageously increases the effective transmission rate and may not effectively improve the BER in low bit energy to noise power spectral density Eb/No applications.

In recent years, the newly developed turbo code method has been demonstrated to be a very powerful tool for forward error correction of corrupted data communicated across noisy data channels. Turbo coding can provide significant coding gain within a fraction of 1 dB from the theoretical Shannon limit. This coding gain presents a promising future for power limited communication systems, such as a satellite communication system. The turbo code can provide significant coding gain at low Eb/No. In comparison with the commonly used concatenated Reed-Solomon convolutional codes, an additional coding gain can be achieved. Transfer function bound techniques have been studied to analytically compute the upper bound of the BER performance of a parallel concatenated convolutional code with a maximum likelihood decoder based on a trellis diagram and uniform interleaving. It has been shown that the simulated turbo code performance merge to this bound asymptotically. Therefore, this bound has been used to indicate where the error floor of a turbo code is located.

Turbo coding is a block code process using a transmitting turbo encoder and a receiving turbo decoder. In the case of continuous data transmission, turbo coding requires that the data stream be packetized into blocks for processing an entire message by blocks of N data bits. The turbo encoder provides systematic data bits uk and includes a first and a second constituent convolutional recursive encoders respectively providing e1 and e2 outputs of code bits. The first encoder operates on the systematic data bits providing the e1 output of code bits. An encoder interleaver provides interleaved systematic data bits then fed into the second encoder. The second encoder operates on the interleaved data bits providing the e2 output of code bits. The data uk and code bits e1 and e2 are concurrently processed and communicated in blocks of digital bits.

The conditional probability that the constituent encoder generates a codeword of weight dc given an information sequence of weight i and block size N can be expressed as $pc(dc|i)=t(N,i,dc)/C(N,i)$, where $C(N,i)$ is the number of combinations of N bits taken i at a time, and $t(N,i,d)$ is the number of codewords of weight d, which is simply the coefficient of the term $L^N*I^i*D^d$ of the transfer function $T(L,I,D)$ of the constituent code with * being multiplication. Based on the assumption of uniform interleaving, the conditional probability of having a turbo codeword with a total weight of d given an information sequence of weight i and block size N is $p(d|i)=p0(d0|i)*pc1(d1|i)*pc2(d2|i)$ where $d=d0+d1+d2$ with d0 being the weight of the systematic fragment of the codeword, d1 and d2 being weights of the encoded fragments corresponding to the first and second constituent encoder, respectively. The term $p0(d0|i)$ is a delta function $d(i,d0)$, and $pc1(d1|i)$ and $pc2(d2|i)$ are given by the $pc(dc|i)$ equation. Applying well-known union bound techniques, the probability of bit error Pb for turbo codes can be expressed by a Pb summation equation of Pb being less than the summation from i=1 to N of $(i/N)*C(N,i)*Ed|i[Q[sqrt(2*d*(Es/No))]]$, where the conditional expectation $Ed|i(.)$ is over the probability distribution function given by the $p(d|i)$ equation and $Q(.)$ is the complementary Gaussian distribution function with zero mean and unit variance, sqrt is the square root function, $Es=R*Eb$ with R being the code rate. Therefore, the structure of the constituent encoder provides the transfer function $T(L,I,D)$ and, as a result, the asymptotic BER performance, which can be used to locate the error floor, can be evaluated.

The second interleaver for the second encoder is an essential device for the turbo code structure. The encoder interleaver is used to increase the minimum Hamming distance between code words represented by the state transitions within the trellis diagram. The longer the Hamming distance between adjacent code words, the larger an error must be to be uncorrectable. Without this second interleaver, the Hamming weight of the combined two code sequences, e1 and e2, is only doubled using two identical constituent encoders. With the code rate decreased, the effectiveness of using concatenation is diminished. However, by uniquely interleaving the information systematic sequence that generates the minimum Hamming weight, and generates an interleaved systematic input to the second constituent encoder, the Hamming weight of the second code sequence e2 can be higher than that of the first code sequence e1.

In order to prevent the processing of a block of information from affecting the processing of the next block, the turbo encoder needs to be flushed at the end of each block. Flushing is the process of entering respective sequences of input flushing bits into the constituent encoders so that the contents of the respective shift registers of the encoders become all zeros, to put the encoders in the zero state, at the end of this flushing process. Because the turbo code adopts the recursive convolutional encoders, entering consecutive K-1 zero bits, where K is the constraint length of the code, does not flush the encoder as it does for the conventional nonrecursive convolutional encoder. The flushing bits for the first encoder are not part of, but are appended to, the informational root systematic data sequence. A first series of systematic tail bits are fed into the first encoder to flush the first encoder to the zero state as the first encoder generates parity check tail bits, after which, a second series of flushing bits are fed into the second encoder to flush the second encoder to the zero state while generating second parity check tail bits. Flushing the second constituent encoder, in the conventional manner, is to insert m generated input flushing bits to clear the contents of the shift register to all zeros. At the end of this flushing process, the corresponding path on the trellis diagram terminates at the all-zero state for both encoders. The flushing bits are particularly generated to flush the encoders into the zero state.

The first encoder operates on the systematic data and systematic tail bits to provide the first code bits including the first parity check tail bits while the second encoder operates on an interleaved version of the systematic data bits only to provide the second code bits and then generates the second parity check tail bits as appended to the second code bits. At the end of the systematic sequence, a first series of flushing bits is generated and used to flush the first encoder to the zero state as the first encoder generates first parity check tail bits appended to the first code bits, and concurrently, the first set of flushing bits is appended to the systematic data sequence of data bits as systematic tail bits, while concurrently, a second set of generated flushing bits is used to flush the second encoder to the zero state generating the second parity check tail bits without interleaving or appending this second set of flushing bits. Flushing of the second constituent turbo encoder create a tail effect inherent in block turbo encoding and decoding. Flushing of the constituent encoders provides known ending zero states to which forward recursion ends and from which backward recursion begins when estimating the systematic data sequence during decoding. The second encoder provides the second parity check tail bits from the second series of flushing bits which, however, are not appended to the systematic data bits, and hence, the second encoder does not have parity check tail bits encoded from the systematic tail bits as does the first encoder. Therefore, a tail effect is created by a mismatch between the systematic tail bits and the second encoder parity check tail bits. This tail effect does not extend to the first encoder parity check tail bits that were encoded from the systematic tail bits. Consequently, the entire systematic data and tail bit sequence can be compared to the entire string of first code bits for data verification. However, only the root portion of the systematic data sequence can be compared to the root portion of the second code bits, and disadvantageously the second parity check tail bits can not be compared to the systematic tail bits for verification. This difference in verification capability results from the tail effect mismatch. Hence, and as a result of the flushing process, there is a difference between the two sets of flushing bits respectively for the first and second encoders. This tail effect mismatch exists between the first set of flushing systematic tail bits that flush the first encoder to the zero state and the second set of flushing tail bits that flush the second constituent encoder to the zero state. As a result of this tail effect mismatch, the decoder can not compare the systematic tail bits against the second parity check tail bits. Such tail effects are a factor causing the error floor in turbo coding. Flushing of both of the constituent encoders is conventional practice in the art to terminate the encoding process to the zero state, but with the resulting error floor from the tail effect mismatch. But, a benefit of flushing the encoders to the zero state is that the decoder can take advantage of such known information to assist in the decision-making process for determining the systematic data bits. Specifically, the backward recursion of the turbo decoding process can start from this known zero state with a probability of one.

Turbo coding operates on blocks of input data bits dk. The turbo encoder includes the first and second recursive encoders having respectively data inputs and interleaved data inputs for providing respective strings of code bits e1 and e2, and includes a data channel providing the systematic unaltered data bits u. The code bits and data bits are used as branch words extending between states used in a Viterbi search algorithm using a trellis state diagram. Each encoder includes an feedback shift register having a limited number of determined states. As data bits or interleaved data bits are fed into the shift register, the encoder jumps among the states depending on the input bits as the encoder generates code bits. The data bits and code bits define possible branchwords. The code bits and data bits are transmitted over a noisy channel creating errors in the received code and data bits. At the decoder, the states and transitional branch words can be depicted using a trellis diagram upon which a-posteriori probability algorithm is applied to determine state metric values throughout the trellis diagram, and therefore the most probable transitions between states which then determines the data bit and code bits which should have been received so as to enable correction of erroneously received code and data bits. The a-posteriori probability algorithm can be applied in both forward and backward recursions using soft metrics based on channel characteristics and a-priori probabilities of bits being zeros or ones. The encoders start in the zero state and are flushed at the end of the block of data bits to end in the zero state. The a-posteriori probability algorithm is thus applied to known starting and ending states, and, sets of state metrics between the starting and ending states can be computed based upon conventional metric computational algorithms.

While the information data sequence, denoted by u, is being fed into the first encoder, an encoded sequence of N code bits, denoted by e1, is generated accordingly. The flushing systematic tail bits for the first encoder are appended to the tail of data sequence u, and combined as part of the systematic sequence uk that is transmitted over the channel. The m=K-1 flushing tail bits are referred to as systematic tail bits, denoted by u*. Associated with these systematic tail bits, the first encoder generates m parity check tail bits, denoted by e1*, which are appended to the tail of the first encoded sequence e1. Along with the systematic sequence u;u* the first code sequence e1;e1* is transmitted over the channel. The input sequence to the second constituent encoder is the interleaved version of u, denoted by p(u). The second code bit e2 are generated from interleaved data p(u). During the process of flushing the second encoder, the tail bits e2* are appended to the second code bits, Hence, for each block of N information bits, there are three (N+m) block strings uk=u;u*, e1k=e1;e1*, and e2k=e2;e2* transmitted through the noisy communication channel.

The data structures of the input and output sequences for both constituent encoders may be plotted as paths on trellis diagrams. The data structures of the systematic and code sequences that are transmitted over a noisy channel are assumed to be corrupted. The redundancy of the code sequences offers additional information for correcting data bit errors. The output data structure for turbo encoder includes one set of systematic data bits uk and two sets of code bits e1k and e2k providing one set of received systematic data bit sequence Xk and two sets of received code sequences Y1k and Y2k.

A code rate is the ratio of the number of data bits to the number of transmitted channel symbols. Decreasing the code rate improves the BER performance. However, for a fixed data rate, decreasing the code rate increases the transmission symbol rates. Channels are bandwidth limited and therefore require limited transmission symbol rates. One way of not increasing the transmission symbol rate while achieving a low code rate performance is to puncture the transmitted symbols. Puncturing is the process of deleting a portion of the transmitted symbols and the puncturing process is characterized by a puncture pattern used by the turbo encoder. Upon receipt of the transmitted punctured code symbols, the turbo decoder implements a bit insertion process that is the inverse function of the puncturing process. Bit insertion requires dummy bits inserted into the received sequence according an insertion pattern as part of the turbo decoding process. The puncturing and corresponding bit insertion processes result in a modest degradation of the BER performance while decreasing the transmission symbol rate to be within the acceptable channel bandwidth. Hence, puncturing and bit insertion processes are desirable in bandwidth limited applications.

The turbo decoder receives digital bits through a noisy channel typically communicating modulated analog signals. The noisy channel may corrupt the transmitted bits uk, e1k and e2k. Typically, a received voltage signal is demodulated into a voltage level and is then assigned a probability based on noisy channel characteristics and bit bias information for translating the received analog signals into digital bits. A communication channel has inherent noise characteristics. Bias information is used to describe the a-priori probability of a bit being a zero or a one. The bias information and the channel noise probability density function combine to provide channel a-posteriori probability estimations. The received digital bits include received systematic data bits Xk corresponding to the transmitted data bits uk, and received first and second code bits Y1k and Y2k corresponding to transmitted first code bits e1k and the second code bits e2k code bits, respectively. An information data bit is associated with a probability of being a zero or a one. Upon reception, the information bit has an initial a-priori probability. The bit has an a-priori probability of being a one or a zero for the received soft signal to provide a data bit estimate, and for computing a posteriori bias information.

The turbo decoder includes first and second a-posteriori probability (APP) decoders, a first decoder interleaver, a second decoder interleaver, an output deinterleaver, a feed back deinterleaver, and a hard limiter. These APP decoders and deinterleavers are connected for providing inverse functions of the encoders and encoder interleaver. The first and second APP decoders operate in the logarithmic domain. The APP decoders compute a-posteriori probabilities of the digital bits. The X and Y1 inputs have the same systematic order and are both inputted into the first APP decoder providing a first APP output in systematic order. The Y2 input is in an interleaved order by virtue of the encoder interleaver. The first APP decoder output is fed into a first decoder interleaver providing a first APP decoder interleaved output in interleaved order and the input X is also fed into the second decoder interleaver providing an X interleaved output in interleaved order. The output of the first APP decoder is an input to the first decoder interleaver providing an interleaved output to the second APP decoder. The second APP decoder provides, in turn, an interleaved bias information output that is deinterleaved by the feed back deinterleaver and fed back to the input of the first APP decoder, and provides an interleaved bit estimate output that is fed to the hard limiter that translates bit estimates into hard zero and one bit values. Hence, the turbo decoder includes a turbo feedback loop configuration for feeding back updated bias information. The output of the first APP decoder is a series of a-posteriori bias information, that is, a bias measurement of X based upon Y1. The X interleaved output, the first APP decoder interleaver output, and the Y2 input, all in interleaved order are fed into a second a-posteriori probability decoder providing the second APP decoder bias and bit estimate outputs in the interleaved order. One of the second APP decoder outputs is a refined APP metric output that is fed into the feedback loop deinterleaver for translating the second APP decoder bias output into systematic order for feed back into the first APP decoder. The feedback metric output and the first APP decoder metric output are a measure of the probability of the data X bits being ones or zeros. The second APP decoder provides bias information as a metric output for feed back and provides the estimate output that is not fed back to provide an estimate of the bit values. The second APP decoder estimate output is not fed back because it includes the first APP decoder metric output which should not influence the processing of the first APP decoder. The first and second APP decoder independently provides repetitive estimations for respective processing interactions.

At the end of the last iteration of the feedback loop turbo processing through the turbo decoder, the second APP decoder estimate output is fed into the output deinterleaver for generating an estimate output in systematic order for processing through the hard limiter for translating the estimates into hard data bit values. The second APP decoder provides an estimate of the systematic data X only at the last iteration. For each iteration, the second APP decoder provides a feedback bias metric output that is fed back into the first APP decoder. The estimate output of the second APP decoder is a logarithmic likelihood ratio output. The estimate output, in systematic order, is fed into a hard limiter for translating bit logarithmic likelihood ratios into zero and one bits of blocks of systematic data bits.

Each APP decoder performs branch and state metric computation during the forward recursion and backward recursion. The process of the forward recursion in the first and second APP decoders starts at the all-zero state with a probability of one, because the first and second encoder is always initialized at the all-zero state. The backward recursion in the first and second APP decoders also always starts from the all-zero state with a probability of one, because the first or second encoder always terminates at the all-zero state. At the end of the forward and backward recursions for each iteration, the first and second decoders perform logarithmic likelihood function calculation to provide the first and second decoder bias outputs as well as the second decoder estimate output.

The u*tail bits and e1* tail bits are the true matched pairs by virtue of encoding the u*tail bits in the first encoder so that the corresponding X* and Y1* tail bits can assist each other in determining decoded bits during the decoding. For example, if a parity check tail bit in e1* is severely corrupted and the corresponding systematic tail bit in u* is not, the use of X* can be used to correct the corruption of the Y1* bit, and vice versa. This is not true for the e2* and u* systematic tail bits because the e2* tail bits were not encoded in the second encoder from the u* systematic tail bits. During decoding using the e2* second parity check tail bits, arbitrary corresponding systematic tail bits u* may be used for error correction with a resulting inherent error floor. Specifically, the systematic tail bits X* cannot be used for decoding in the second APP decoder because the X* tail bits were not used to generate the Y2* tail bits. Using X* for decoding of the second parity check tail bits will cause unnecessary decoding errors at the tail portion resulting in the inherent error floor.

Therefore, after completing the decoding of the information root portion of Y2k, the systematic input X* is then effectively shut off with the X* systematic tail bit set to zero bit values. The lack of these systematic tail bits X* during the decoding of the second code bits Y2 limits the ability to correct the corruption of Y2* parity check tail bits and thereby limits the accuracy of the bit estimates creating the error floor. As such, decoding errors likely will exist at the tail in the event that Y2* is corrupted. Such errors may then propagate to the information root portion of the systematic sequence Xk. Although these errors may be corrected by the first APP decoder in subsequent iterations, the effect of these errors are continuously injected into the decoding process from one iteration to another.

The turbo code requires that the first and second encoders be flushed at the end of the information sequence. However, flushing the second constituent encoder results in a tail effect, with a mismatch between the second encoder parity check tail bits and the systematic tail bits. This mismatched tail effect of the conventional turbo decoders causes the two trellis paths of highest probability in the forward and backward recursions of the second APP decoder to not merge together at the tail portion of a block. Forward recursions may end at non zero states with the highest probability and yet backward recursions must start at the all zero states with a probability of one because the second encoder was flushed to the zero state resulting in a mismatch between the forward and backward recursions. Mismatches between forward and backward recursions is processed in the second APP decoder. When the second APP decoder decodes the k-th bit based on the likelihood function, which depends on forward metrics, backward metrics, and the branch metric at bit time k, this mismatch will cause the decision to wander between the forward and backward recursion paths from one iteration to another. Such instability creates some decoding errors in the rear section of the root data portion. This tail effect limits the ability of the decoder to correct error and hence establishes an inherent error floor during turbo decoding. These and other disadvantages are solved or reduced using the invention.

SUMMARY OF THE INVENTION

An object of the invention is to provide a modified second a-posteriori probability (APP) decoder for enabling backward recursion starting from all possible ending states during turbo decoding.

Another object of the invention is to provide for majority selection of iterative estimations of systematic data bits estimated by the modified second APP decoder.

Another object of the invention is to interleave flushing bits with systematic data bits as an interleaved block input to a second encoder providing a block of second code bits for reducing the error floor of a turbo encoder-decoder system.

An object of the invention is to reduce the error rate of turbo code communication systems.

Another object of the invention is to use bit partitioning of systematic data bits providing a repetitive encoder input for reducing the error rate of turbo code communication systems.

The invention is a method for reducing the error rate in turbo coding. A first aspect of the invention is to reduce the tail effect that is created when flushing the second constituent turbo encoder so that the error floor is reduced. A second aspect of the invention uses turbo encoding bit partitioning for reducing the error rate in turbo coding systems.

The first aspect of the turbo decoding method is characterized by backward recursion starting from all possible states. The method avoids the mismatch between the ending state of the forward recursion and the beginning state of the backward recursions in the turbo decoding process. Preferably, the second encoder need not be flushed to the zero state, and preferably uses the systematic tail bits to terminate the encoding of the second encoder so that the turbo encoder can provide both systematic tail bits and parity check tail bits for both encoders without requiring a flushing to the all zero ending state of the second encoder. The second constituent encoder is not flushed. The method can eliminate the mismatch between the systematic and parity-check tail bits in the second code bits of the second encoder. Preferably, the second encoder operates on an interleaved order of the systematic data and tail bits whereas the first encoder operates on a systematic order of the systematic data and tail bits, hence, both encoders operate on the same systematic data set having the same number of data bits convenient for block processing, and both sets of encoder code bits can be used with the corresponding systematic data bits for data correction. Specifically, the second parity check tail bits can be used in combination with the systematic tail bits in a modified second a-posteriori probability decoder for better decoding results. The invention prevents errors from propagating from the tail portion to the information root portion of the block. The method may further reduce the decoding delay. This method can cause the error rate to converge more rapidly to a final solution.

The method is preferably enhanced by majority selection among hard decisions from all previous iterations of systematic data estimations during turbo decoding. During each iteration, the hard limiter provides a hard one or zero value, as a single vote occurrence, for each bit, and after all of the iterations, the value of zero or one is chosen based on the higher vote occurrence, for each data bit of the block of N data bits. Majority selection of iterative decoding results is used to reduce decoding errors by taking the majority value of ones or zeros of the estimated bits, and in the event of a tie, the bit value of the last iteration is selected.

The first aspect of the method not only further improves the BER performance, but may also reduce the decoding delay of the turbo decoder. The method can be used in many types of communication systems, such as, wire communication, wireless communications, and satellite communications. The mitigation method is developed to cure the tail effect and simulation results show that the BER continues to drop beyond the analytical transfer function bound, and shows that there is no error floor at all down to a BER range of 1×10E-8.

The second aspect of the invention is repetitive turbo coding for improving coding gain, and therefore the BER performance, by using bit partitioning of the systematic sequence prior to encoding in the turbo encoder and by using a corresponding inverse bit insertion process in the turbo decoder. The repetitive turbo coding process increases the minimum Hamming distance for improved coding gain. The repetitive turbo coding method of the second aspect can be used in combination with the first aspect of the invention as a comprehensively improved turbo coding communication system. These and other advantages will become more apparent from the following detailed description of the preferred embodiment.

DETAILED DESCRIPTION OF THE PREFERRED EMBODIMENT

Figure 1:
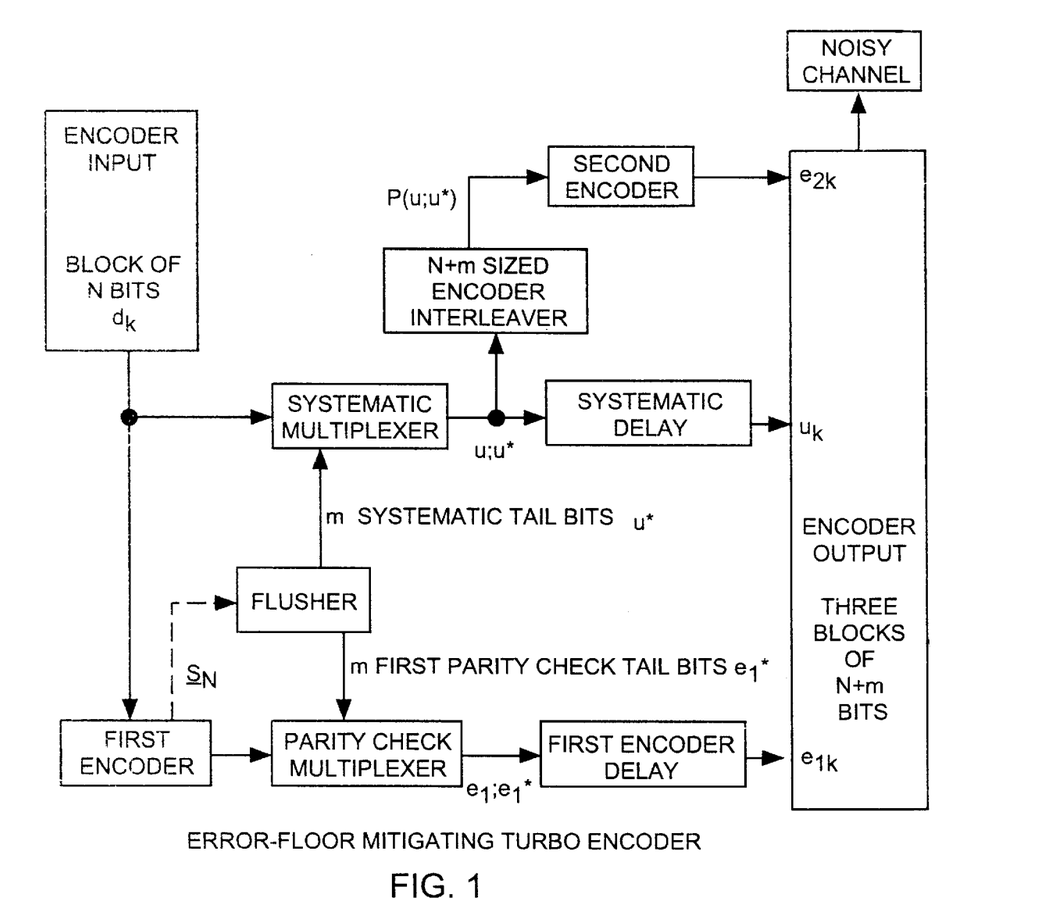
FIG. 1 is a block diagram of an error-floor mitigating turbo encoder.
Figure 2:
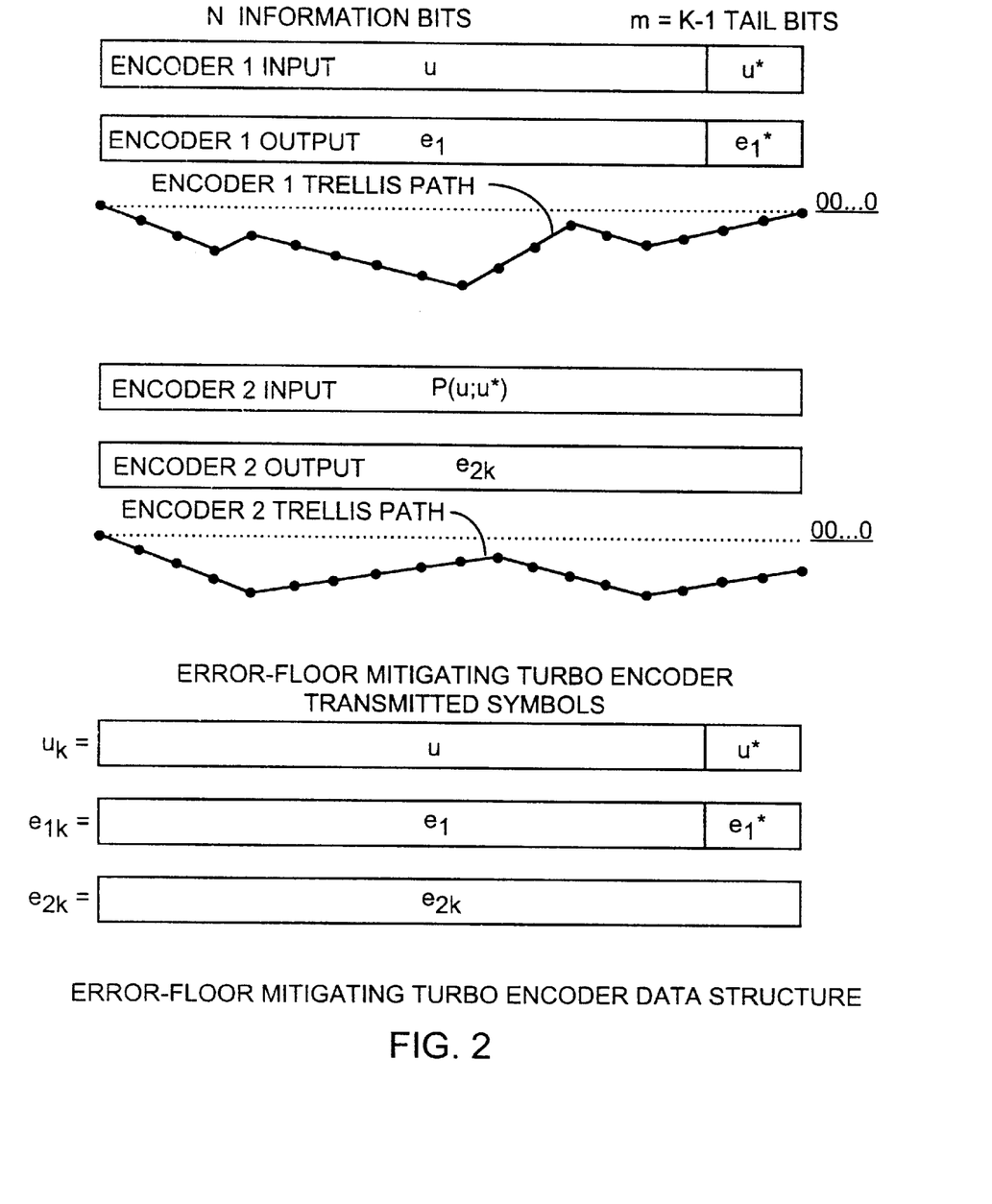
FIG. 2 is a diagram of an error-floor mitigating turbo encoder data structure of the error-floor mitigating turbo encoder.

An embodiment of the invention is described with reference to the figures. FIGS. 1 through 4 depict the first aspect of the invention directed to error floor mitigation, and FIGS. 5 through 8 depict the second aspect of the invention directed to bit partitioning. Referring to FIGS. 1 and 2, an error floor mitigating turbo encoder receives, as an encoder input, a block of N bits of a systematic data sequence of data bits dk. The data sequence dk is fed into a first constituent convolutional recursive encoder providing first code bits e1 fed into a parity check multiplexer providing the first code bit e1 to a first encoder delay. While the data sequence dk is being fed into the first constituent encoder, the data sequence dk is concurrently fed through a systematic multiplexer communicating the data sequence, designated u and referred to as systematic data bits that are then fed into a systematic delay and an encoder interleaver. At the end of the N bits of data sequence dk, a flusher receives an ending state SN from the first encoder and then the flusher generates m systematic tail bits u*. The flusher concurrently generates m parity check tail bits e1*. The m systematic tail bits u* are communicated to the systematic multiplexer that then appends the systematic tail bits u* to the systematic data sequence u. The systematic multiplexer communicates the systematic data bits u and systematic tail bits u* to the systematic delay and to an encoder interleaver. The systematic delay communicates both systematic data bits u and appended systematic tail bits u* to the encoder output as a block of N systematic data bits u and m systematic tail bits u*. The systematic data output is designated as uk having N+m data and tail bits whereas the original data sequence dk only has N data bits.

As the m systematic tail bits u* are being generated and fed into the systematic multiplexer, the flusher concurrently generates the m first parity check bits e1* and communicates the m first parity check bits e1* to the parity check multiplexer which appends the m first parity check tail bits e1* to the code bits e1 and communicates the first code bits e1 and m parity check tail bits e1* as a string of first code bits e1k to the first encoder delay providing a first encoder output e1k as an appended string of first encoder code bits. The entire string of first code bits e1k is communicated through the first encoder delay as a block of N+m first encoder code bits e1k.

As the systematic data sequence string uk=u;u* is fed to the systematic delay, and as the first encoder string of code bits e1k=e1;e1* is fed to the first encoder delay, the systematic string uk, consisting of the systematic data bits u and systematic tail bits u* is concurrently fed to the encoder interleaver. The systematic multiplexer routes the m systematic tail bits u* to the encoder interleaver and to the systematic delay concurrently as parity check multiplexer routes the parity check tail bits e1* to the first encoder delay. The encoder interleaver operates upon and interleaves the entire systematic string uk, to then provide an interleaved output P(u;u*) after an interleaver time delay. The encoder interleaved output P(u:u*) is fed into the second constituent recursive encoder providing an N+m block of second code bits e2k.

The systematic multiplexer communicates the systematic data bit u and appended systematic tail bits u* to the systematic delay for time delay, concurrently as the parity check multiplexer communicates the first encoder code bits e1 and first parity check tail bits e1* to the first encoder delay for concurrent time delay, while the encoder interleaver interleaves systematic data string u;u*. Significantly, the systematic tail bits u*, used to emulate the flushing of the first encoder, are interleaved with the systematic data sequence u without flushing the second encoder to the zero state. After the tail bits u* are created at the end of the flushing process in the first encoder, the entire systematic sequence string uk=u;u* is interleaved and fed into the second encoder. This may lead to the second encoder not terminating at the all-zero state. In order to avoid carrying any memory over to the next block, the second encoder is cleared instantaneously after generating the entire sequence of the second parity-check code bit e2k. After interleaving, the encoder interleaver output P(u;u*) is fed into the second constituent encoder providing an N+m string of second code bits e2k as part of the encoder output. The systematic delay delays the systematic sequence uk as the first encoder delay delays the first encoder string e1k, to provide sufficient time for the encoder interleaver to interleave the systematic data string u;u* and sufficient time for the second encoder to encode the interleaved output P(u;u*) into the second encoder string of second code bits e2k. The second encoder output e2k is an interleaved encoded output of an entire N+m block of second code bits, whereas the systematic output uk consists of N systematic data bits u and m systematic tail bits u*, and whereas the first encoder output e1k consists of N code bits e1 and m parity check tail bits e1*. As such, the first encoder delay and the systematic delay operate to provide synchronism between the block of N+m bits of the second code bits e2k with the block of N+m bits of systematic output uk and with the block of N+m bits of first code bits e1k. Hence, the systematic data bits uk output consisting of the N systematic data bits u and m systematic tall bits u*, first encoded output string e1k consisting of the N first code bits e1 and m parity check tail bits e1*, and the second coded N+m bits e2k output encoded from the encoder interleaver output P(u;u*) all have the same N+m block length and are communicated by the encoder output in synchronism, typically through a noisy channel.

At the end of receiving the input data sequence dk, flushing of the first encoder to the zero state is emulated by the flusher generating the m systematic tails bits and m first parity check tail bits and resetting the first encoder to the zero state. During the process of flushing, the parity check multiplexer receives the m first parity check tail bits e1* and appends the parity check tail bits e1* to the first encoder output e1 for the first encoder output ek, as the first encoder is reset to the zero state without the first encoder actually generating the parity check tail bits. The systematic tail bits effectively emulated flushing tail bits of the first encoder. This emulated flushing operation, emulates the flushing of the first encoder to the zero state, as if the m systematic m tail bits u* were fed into the first encoder then being flushed to the zero state while generating the first parity check tail bits e1*. This flushing emulation could be, alternatively, a hard wired operation with the flusher communicating the systematic tail bit u* directly into the first encoder then generating the first parity check tail bits e1*. However, a practical implementation of the flusher may include a flusher memory look up table, where the ending state SN, read by the flusher, points to the systematic tail bits u* and to the first parity check tail bits e1*. As part of the emulated flushing process, the first encoder is reset to the zero state which typically means clearing the contents of the shift registers, not shown, with the first encoder having a constrain length K, where m equals K-1.

The encoder output provides three blocks of equal N+m length output sequences uk, e1k, and e2k communicated in time synchronism, with the first encoder being flushed to the zero state. However, the second encoder is not flushed to the zero state, in that, there are no second encoder flushing tail bits used to flush the second encoder to the zero state. The second encoder is simply reset to the zero state before the beginning of the next block of input data dk. The lack of flushing of the second encoder affects the operation of the turbo decoder.

Referring to FIG. 2, the input to the first encoder includes N systematic data bits u followed by m systematic tail bits u* that are the flushing bits to terminate the first encoder to the all-zero state in the trellis diagram. Corresponding to this input sequence, the first encoder generates a first code sequence e1k that consists of N code bits e1 followed by m parity check tail bits e1*. The input to the second encoder is the interleaved version of the entire N+m bit input sequence to the first encoder, P(u;u*), including the systematic tailbits u*. Corresponding to this input sequence, the second encoder generates a second code sequence e2k of length N+m. Because the second encoder needs no flushing, the second encoder trellis path may not terminate at the all-zero state in the trellis diagram. At the end of the encoding process, the systematic sequence uk=u;u*, the first encoder code sequence e1k=e1;e1*, and the second encoder code sequence e2k are transmitted to the noisy channel.

Figure 3:
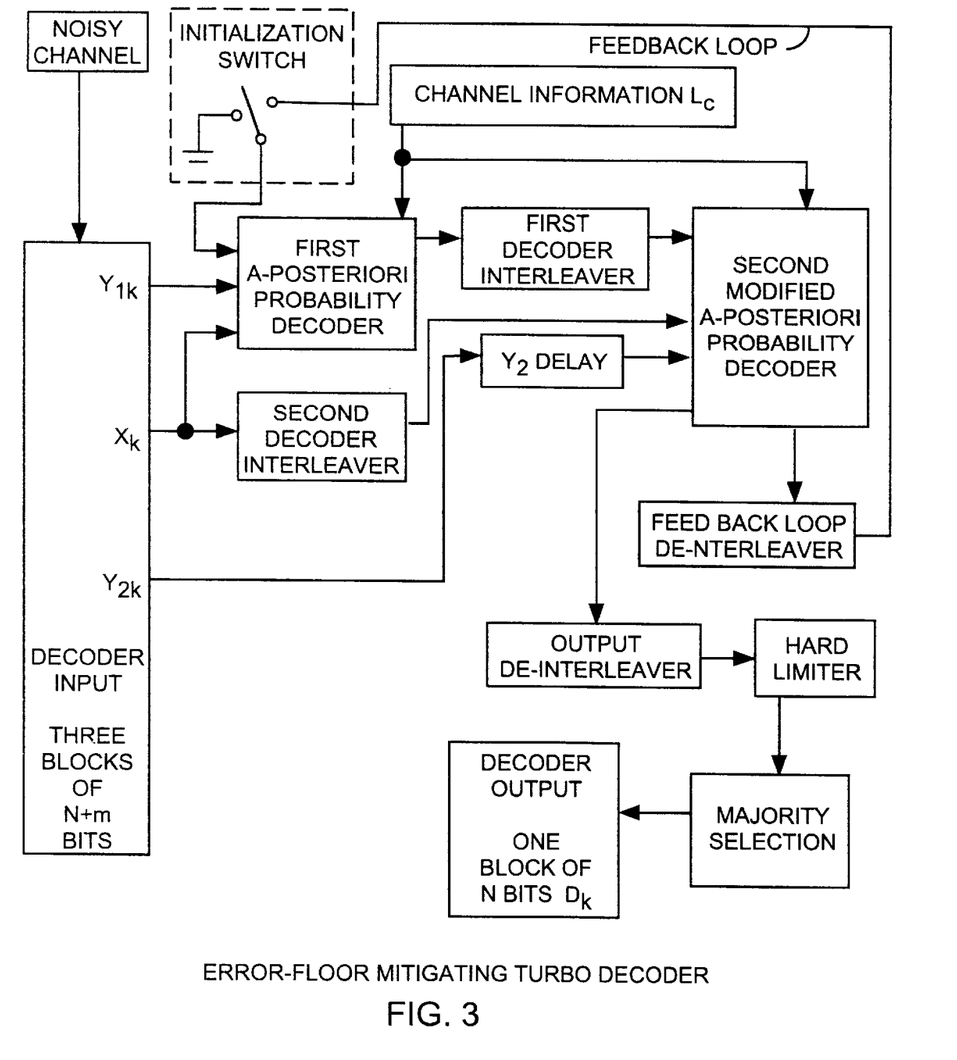
FIG. 3 is a block diagram of an error-floor mitigating turbo decoder having a modified second a-posteriori probability (APP) decoder with preferred majority selection.

Referring to FIGS. 1 through 4, and particularly the turbo decoder of FIG. 3, the encoder outputs uk, e1k and e2k are received by the turbo decoder over the noisy channel as respective systematic decoder input Xk, first coded decoder input Y1k and second coded decoder input Y2k. The systematic input Xk and the first coded input Y1k are fed into the first a-posteriori probability (APP) decoder. An initial estimate of bias information indicated by an initialization switch is also fed into the first APP decoder. The first APP decoder provides a bias estimate output that is fed into a first decoder interleaver providing a first decoder interleaver output, as the systematic decoder input Xk is concurrently fed into a second decoder interleaver providing a second decoder interleaved output. The second coded input Y2k is fed into a Y2 delay matching the processing delay taken by the second decoder interleaver and providing a delayed Y2k input to the second modified a-posteriori probability (APP) decoder. The Y2 delay provides for time synchronism of the inputs to the second modified APP decoder. Initially, the initialization switch is set to zero indicating that the first APP decoder will use initial bias estimates of the received bits a 50/50 middle bias point of being a zero or a one. The channel information defines, for example, the shape of a noise probability density function of a typical receiver demodulator. The second modified APP decoder receives the first and second decoder interleaver outputs as well as the delayed second coded decoder input Y2k, all three of which are in interleaved order. The second APP decoder provides two outputs, one being estimates of systematic data bits and the other being an updated bias information, both in interleaved order. The data bit estimates are soft data bit estimates. The data bit estimates are deinterleaved by an output deinterleaver as the bias information estimates are deinterleaved by a feedback deinterleaver. The data bit estimates and updated bias information outputs are generated and deinterleaved once for each iteration of the turbo decoding process. The data bit estimates are then fed through a hard limiter which translates the soft data bit estimates into zero and one hard data bit values, for each iteration. The hard bit values, for each iteration are then stored in a majority selection. At the end of the turbo decoding iterations, the majority selection selects either a zero or a one, for each systematic data bit, depending on the number of one and zero vote occurrences acquired during the iterations. In the event of a tie vote occurrences, the bit value of the last iteration is selected by the majority selection. The majority selection provides the decoder output of a block of N systematic data bits Dk.

During each iteration of the turbo decoding, each of the first and second APP decoders includes the processes of forward and backward recursion. The processes of forward and backward recursions in the APP decoders trace along the trellis diagram in both the forward and backward directions while computing state metric values including forward recursion metrics ak(i), and backward recursion metrics bk(i), for the transmitted systematic data sequence uk passing through state i, where i=0, . . . , 2E(m)-1, at bit index k, where E is the exponent function and where k=1, . . . , N+m, based on the received systematic bits Xk, received first code bits Y1k and received second code bits Y2k. The process of forward and backward recursion involves the computation of state metrics having values for each state in the trellis diagram that includes 2E(m) states for each k bit index. In the trellis diagram, each state is connected with two preceding states and two succeeding states by two forward and two backward possible connecting branchwords, respectively. Each branchword is defined by the received Xk data bit and corresponding code bits Y1k or Y2k and extend between states in the trellis diagram, wherein each state represents the state of the first or second encoder defined by respective internal shift registers. During the forward and backward recursion processes, branch metrics are computed for each branchword and then state metrics are computed for each state. Each of the first and second APP decoders perform forward and backward recursive metric computation. The first APP decoder provides bias information to the second APP decoder that provides updated bias information to the first APP decoder through the feed back loop and which provides data bit estimates as well, during each iteration. During turbo decoding, the bias estimates, updated bias information, and data bit estimates are updated for each iteration for a predetermined number of iterations. Each state metric computation is based upon the preceding branchword metrics and state metrics leading to the subject state. Each state has a computed metric for each iteration and for each forward or backward recursion. The computed metrics include metric values for all states over the entire 2E(m)×(N+m) state space and is a function of the channel noise probability density function and updated bias information, and a function of received data bits Xk and code bits Y1k or Y2k for respective first and second APP decoders. The first APP decoder computes metric values using the received first code bits Y1k and the second APP decoder computes metric values using the received second code bits Y2k. The computed metrics for the entire state space are computed during forward recursion and then again during backward recursion. The computed a-posteriori estimates include bias estimates that are used as the a-priori information for the next APP decoding operation. After computing the forward and backward state metrics, the a-posteriori bias estimates and bias information are updated in the first and second decoders, respectively. The second APP decoder also updates data bit estimates for majority selection.

Both forward and backward recursions of the first APP decoder start at the all zero state with a probability of one. However, the forward recursion of the second APP decoder may not end in the all zero terminating state because the second constituent encoder was not flushed by flushing bits to the all zero ending state. The forward recursion of the second APP decoder using the N+m second code bits Y2k may terminate in any possible ending state, and hence, the backward recursion in the second APP decoder may start from any possible beginning state. It should now become apparent that there is no longer a mismatch between the forward recursion ending state and the backward recursion beginning state in the second modified APP decoder. Particularly, the first APP decoder forward and backward recursions both begin and end in the all zero state with a probability of one, whereas the second APP decoder forward recursion starts in the all zero state and ends in any possible ending state while the backward recursion begins in any possible states and ends in the all zero state. And hence, the second APP decoder is modified to enable the ending of the forward recursion and the beginning of the backward recursion in any possible state, by initializing backward recursion state metrics to all possible states using ending state metrics of the forward recursion.

The second APP decoder is modified so that the backward recursion does not start at the all-zero state with probability one. Instead, the backward recursion starts from all possible states i=0, . . . , 2E(m)-1 with the same state metrics that the forward recursion terminates, meaning bN+m(i)=aN+m(i) for all states i. Although the APP second decoding does not take advantage of the known fact that the sequence e2k can terminate at the all-zero state, the decoding process enables the forward and backward recursion paths of the highest probabilities to merge together at the end of the data root portion of the data sequence Xk. Starting the backward recursion from any possible state can reduce the probability of the second APP decoder making decoding errors at the end of the data root portion. There still may be decoding errors at the tail portion in the last m tail bits of a block. However, tail bit errors will not be counted since the tail bits are not part of the actual information data bits.

Figure 4:
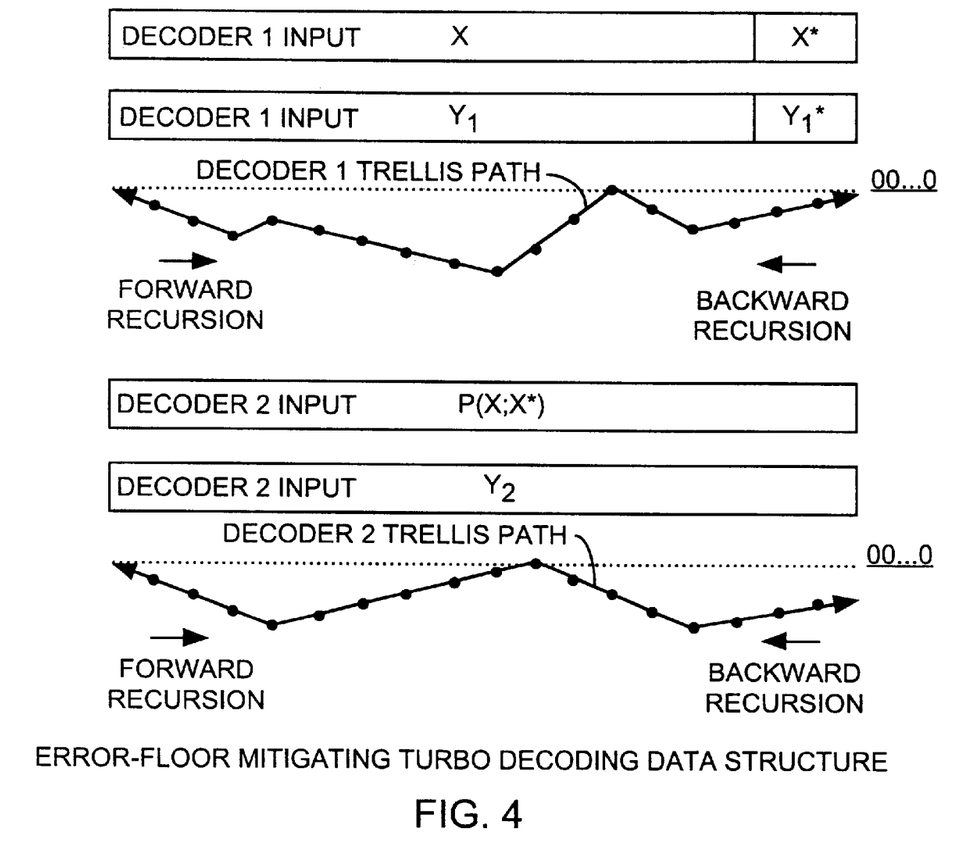
FIG. 4 is a diagram of an error-floor mitigating turbo encoder data structure of the error-floor mitigating turbo decoder.

Referring to FIGS. 3 and 4, the turbo decoding process involves several iterations. The decoding process starts with a priori initial bias information related to an initial estimate of the data bits being zeros or ones. During each iteration, both of the first and second APP decoders perform a forward recursion followed by a backward recursion. The forward and backward recursions involve the computations of state metrics typically stored as a table of metric values along a trellis diagram having a state space matrix of 2E(m) vertical states by N+m horizontal bits. The first decoder operates on the received systematic data bits Xk=X;X* and the received first code bits Y1k=Y1;Y1*, executing firstly a forward recursion and then a backward recursion to generate a-posteriori bias information based on all-zero beginning and end states. The second decoder operates on the interleaved systematic data bits Xk and the received second code bits Y1k, executing firstly a forward recursion and then a backward recursion to generate a-posteriori bias information and data bit estimates based on all-zero beginning state and all possible end states. The first decoder performs forward and backward recursions from the all zero state with a probability of one. The modified second APP decoder first generates the forward recursion state metric having any ending state values that are then used to initialize the backward recursion starting from any ending state. At the end of the forward recursion, the ending state metric values of all possible ending states are used to initialize the beginning state metric values for all possible beginning states at the beginning of backward recursion. After the backward recursion at the end of each iteration, the data bit estimates are subject to hard limiting to zero or one bit values for majoring selection voting, and the a-posteriori updated bias information are fed back to the first APP decoder for adjusting the data bit estimates for the next iteration.

The method of reducing the turbo coding error floor is perfected by not flushing the second encoder and decoding from any possible forward recursion ending state and from any possible backward recursion beginning state. The benefit of not flushing the second encoder is to provide the second code bits Y2k corresponding to the entire systematic data string Xk, for improved decoding. As such, there is no mismatch at all between the systematic tail bits and second parity-check tail bits in tie second APP decoder. The same set of state metrics associated with the forward recursion termination are used as the initial set of state metrics for the backward recursion, that is, bN+m(i)=aN+m(i) for all states i. The second APP decoder is a modified version to the conventional second APP decoder. This modified second APP decoder starts its backward recursion at all 2E(m) possible states, with initial metrics calculated at the end of the forward recursion for every iteration. The first APP decoder still starts its backward recursion from the all-zero state with probability 1.

The majority selection method is an enhancement to turbo coding. At the end of each iteration, a hard decision is made on each bit based on the data bit estimates. The final decoded bit is declared to be a one if the majority of the hard decisions on this particular bit from all previous iterations is one, and otherwise is declared to be zero. If there is a tie, the current and last hard decision outcome is declared to be the value of the decoded bit.

The simulations with the adoption of the error-floor mitigating turbo coding method were performed to illustrate the BER performances of codes for block sizes of 110, 506 and 1024 with constraint lengths of 3, 4 and 5. Significantly, the BER performances do not merge with the analytical transfer function bounds. Instead, the simulated BER performance curves continue to drop beyond the analytical transfer function bound which indicating that no error floor exists down to the BER range of 1×10E-8. A feature of the method is that the increase of the constraint length does not improve the performance significantly for short block size. It is well known that increasing the constraint length will increase the decoder complexity exponentially. However, a code with a constraint length of 3 is adequate for block size of about 100 data bits. As the block size increases to the vicinity of 500, the use of the code with a constraint length of 4 can gain 1 dB above the code with a constraint length of 3 at a BER of 1×10E-6. However, using the code with a constraint length of 5 does not significantly further improve the coding gain. When the block size increases to 1000, a code with a constraint length of 5 can provide an additional 0.7 dB coding gain over the code with a constraint length of 4. These results indicate that increasing the constraint length dues not necessarily provide significant coding gain. Hence, for short block size, such as 100, a constraint length of 3 is adequate, and block sizes greater than 1000, codes with a constraint length of 5 is effective.

The tail effects between the systematic and parity-check tail sequences due to flushing the second constituent encoder are eliminated by the error-floor mitigating turbo coding method. The method not only improves the BER performance, but also removes the error floor for turbo coding. To achieve a specific BER, utilizing the method can reduce the number of decoding iterations, resulting in a shorter decoding delay. The method includes features such as ending the forward and beginning the backward recursion for the second decoding at any possible state, not flushing the second encoder, using a block wise interleaved input into the second decoder, and majority selection, to reduce the turbo code error floor.

Referring to FIGS. 5 through 8, the repetitive turbo coding aspect of the invention has unique features of encoding bit partition and deletion. The encoder bit partitioning uses a repetition rate r repeating the systematic sequence data bits prior to encoding. A repetitive turbo encoder for turbo coding uses encoder bit partitioning with a repetitive turbo decoder having a corresponding bit deletion function as a new turbo code repetitive structure, referred to as repetitive turbo coding. Repetitive turbo codes may be used for various code rates and constraint length encoders. For some code configurations, the repetitive structure can further increase the coding gain by approximately 1 dB asymptotically over conventional turbo coding. The repetitive turbo coding method can be used with optional encoder puncturing and decoder bit insertion process for decreasing the required transmission bandwidth.

The second interleaver for the second encoder is an essential device for the turbo code structure. After selecting a specific interleaving pattern, the turbo code BER performance is dominant by the error events created by a particular bit pattern in the systematic sequence that generates the minimum Hamming weight turbo codeword. With the use of repetitive encoding using the bit partitioning, the benefit is to prevent this particular bit pattern from happening in the input sequences to the constituent encoders. Therefore, the minimum Hamming distance of the repetitive turbo code is increased and the BER performance is improved.

Figure 5:
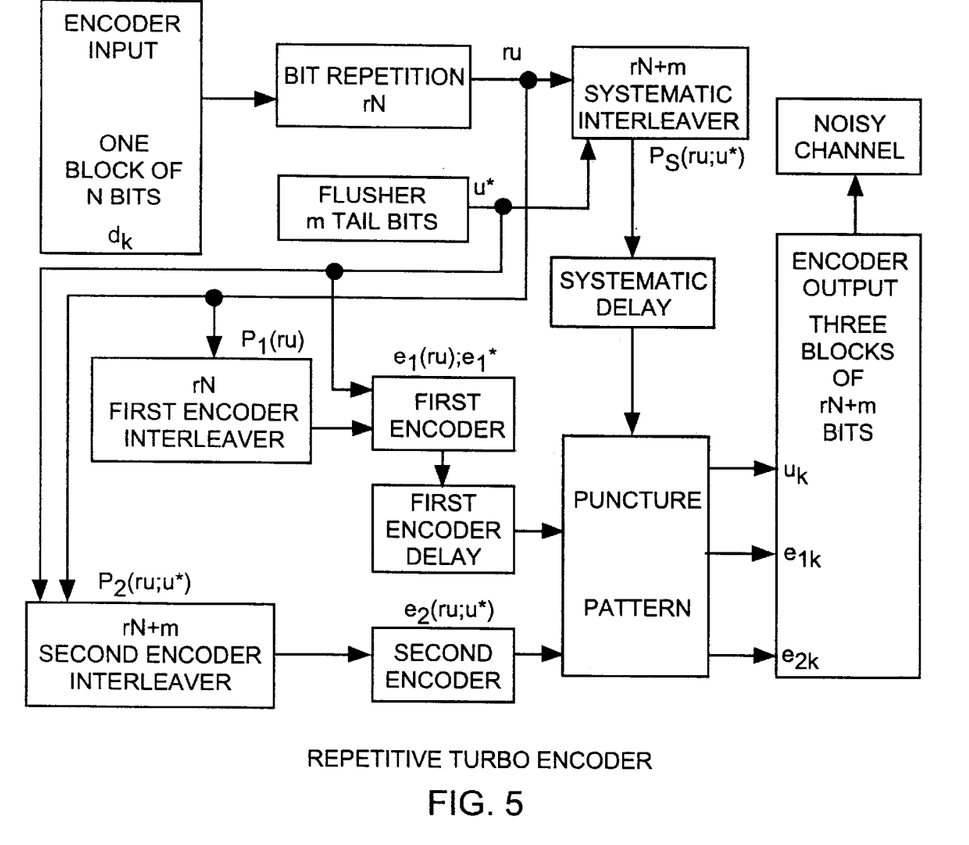
FIG. 5 is a block diagram of a repetitive turbo encoder having a first and second encoder interleaver with a puncture pattern.

Referring particularly to FIG. 5, the encoder input of one block of N bits dk is partitioned by a bit partitioner using a rate of r, in which each input bit is simply divided into r output bits during each input bit time interval. As each bit of the input block is received, the bit is duplicated r times, each of which takes 1/r input bit time. The encoder may operate at a r-times faster clock rate. After the repetitive turbo encoder partitions the entire systematic input block dk, the flusher generates m systematic tail bits u* as an appendage to the repetitive systematic root sequence ru. The flushing tail bits u* depends upon the state of the first encoder at the end of encoding the root portion P1(ru) of the first encoder input sequence. Preferably, the m tail bits are routed to both first and second encoders but the flusher may optimally route different m tail bits to the second encoder. The systematic sequence uk=ru;u*, which consists of rN+m bits, is communicated to the second encoder interleaver. The repetitive systematic sequence uk=ru;u* may also be communicated to an optional systematic interleaver and to an optional first encoder interleaver. When a systematic interleaver is used, an rN+m sized interleaving output PS(ru;u*) is generated and communicated to the systematic delay. When the first encoder interleaver is used, an rN sized interleaved output P1(ru) is generated. The first encoder interleaver permutes the root portion ru of the repetitive systematic sequence. The tail bits u* are appended to generate an rN+m bit first encoder input P1(ru);u* communicated to the first encoder providing the first encoder output e1(ru);e1*. In one form of the invention, the second encoder interleaver operates a rN+m sized interleaving pattern P2(ru;u*) on the entire systematic string ru;u*, generating a second interleaved output P2(ru;u*) fed into the second encoder providing the second encoder output e2(ru;u*). Preferably, the tail bits u* are used in both the first and second encoders enabling the use of the error-floor mitigating turbo coding method. In another form of invention, the second encoder interleaver performs exactly the same operation as the first encoder interleaver except using a different rN sized interleaving pattern P2. In this case, the second encoder interleaver output P2(ru;u*) is in the form of P2(ru);u* and the second encoder output e2(ru;u*) is in the form of e2(ru);e2*, with u* and e2* located at the tail portions of the respective data structures P2(ru) and e2(ru).

The repetitive turbo encoder relies upon repeating every bit of the information sequence dk. The repeated sequence must enter into the second encoder interleaver and may enter into the optional first encoder interleaver. The interleaving patterns of these two interleavers must be different and independent. This dual structure retains the independence between two code sequences e1 and e2. The two interleaved sequences are respectively fed into the two constituent first and second encoders. The delayed systematic string ru;u* and first and second encoder outputs e1(ru;u*) and e2(ru;u*) may be fed into a puncture pattern that, in one embodiment, deletes the replicated bits in the root portion of the systematic string ru;u*, reducing the total number of systematic bits from rN+m to N+m. In other embodiments, the puncture pattern may puncture at a variety of rates and in a variety of patterns on the systematic, first encoder and second encoder output strings. For example, in one embodiment, in addition to the systematic output string uk being punctured to u;u*, the puncture pattern for e1(ru;u*) and e2(ru;u*) sequences may also be the same bit deletion puncture pattern, retaining the same code rate of ⅓, but other puncture patterns may be used. Interleavers and puncture patterns are well known by those skilled in the art. The punctured outputs uk, e1k, and e2k are the turbo encoder outputs of three blocks of possibly different sizes communicated over the noisy channel. A first encoder delay and a systematic delay provide synchronism among the first encoder, second encoder and systematic sequences.

Figure 6:
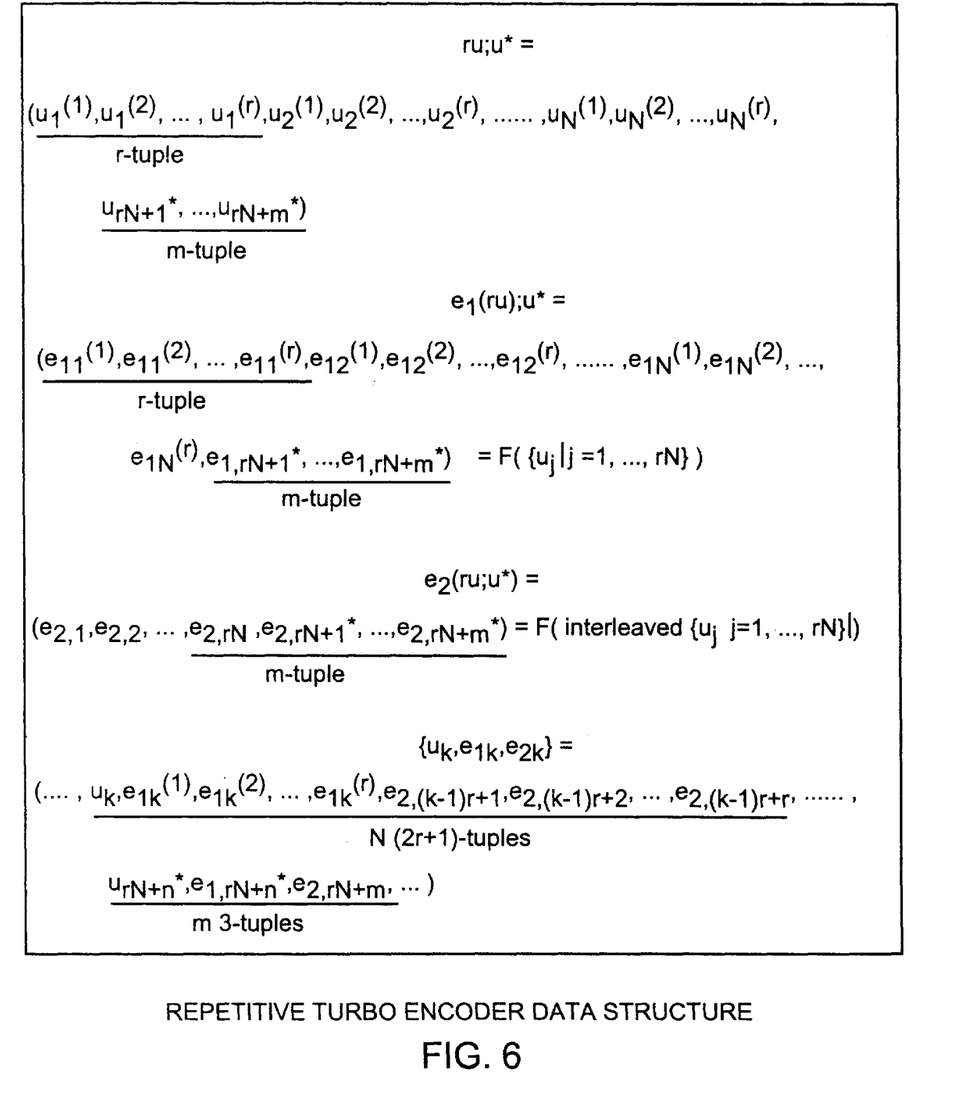
FIG. 6 is a diagram of a repetitive turbo encoder data structure.

Referring to FIG. 6, in one embodiment, neither the systematic interleaver nor the first encoder interleaver is used. The second encoder interleaver operates a rN sized interleaver P2 on the root input sequence ru and appends the flushing tail bits u*, providing an interleaved output in the form of P2(ru);u* to the second encoder. The puncture pattern only deletes the replicated bits in the systematic root sequence ru retaining the original input sequence u appended by the systematic tail bits u*, forming the systematic output string uk=u;u*. The composite turbo encoder output to the noisy channel is represented by {uk,e1k,e2k}. The total number of transmitted channel bits corresponding to a block of N encoder input bits is (2r+1)N+3m.

The repetitive turbo first and second encoder provide a code rate that is lower than a conventional turbo encode without puncturing. It should be apparent that the repeated systematic bits need not be transmitted over the channel, and the simple 1/r puncturing increases the code rate. Without the 1/r puncturing the first and second code bits e1k and e2k, the code rate becomes a rate 1/(2r+1) when N is much greater than m. Using the same rate of reduction in encoded bit, the puncture pattern provides a code rate of ⅓. Various puncturing patterns can be used, but a puncturing pattern providing a 1/r code rate is preferred in some applications.

With the use of bit repetition in the repetitive turbo encoder, the benefit is to prevent the generation of a particular bit pattern providing the nonrepetitive turbo codeword with the smallest Hamming distance, and therefore increases the Hamming distance. There is a benefit of interleaving the systematic sequence as an input to the first encoder is to create a more random sequence into the first encoder, subject to the non-generation of a bit pattern providing the nonrepetitive smallest Hamming distance, resulting in an increase in the Hamming distance for improved turbo decoding. However, there is an insignificant improvement in the decoding process by interleaving and transmitting an interleaved version of the systematic sequence [uk], instead of simply transmitting the systematic sequence uk. Hence, the systematic interleaver for the systematic channel uk does not offer significant coding gain, whereas the use of the first encoder interleaver does provide marginal increase in the coding gain, when using repetitive bit partitioning. The second encoder interleaver is an essential device for the repetitive turbo coding. The benefit of using the second encoder interleaver is to generate a different input sequence to the second encoder from that to the first encoder resulting in a larger minimum Hamming distance. Hence, bit partitioning in combination with both first and second interleaving increases the minimum Hamming distance resulting in improved coding gain. Repeatedly feeding each and every information bit more than once into the encoders is a preferred means for increasing the coding gain.

Figure 7:
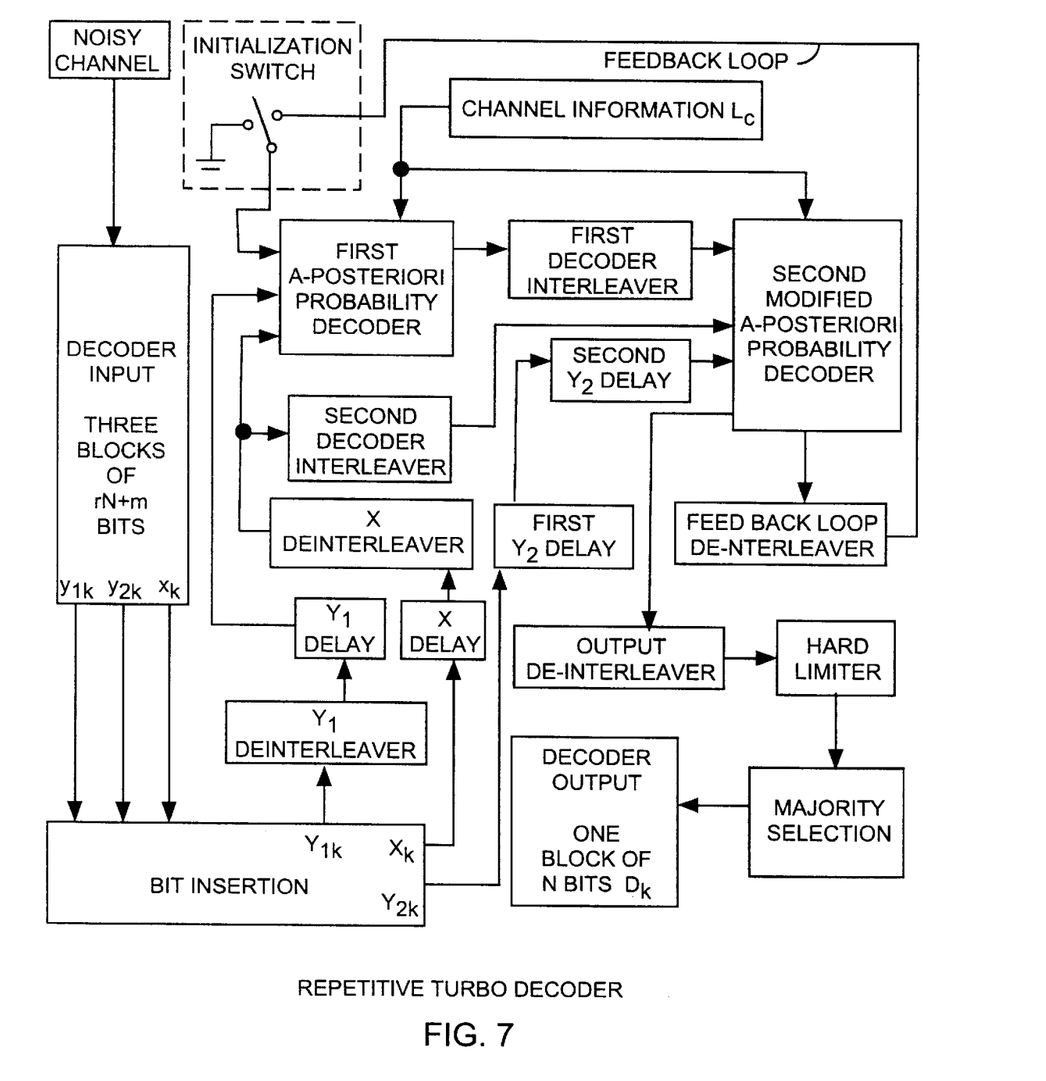
FIG. 7 is a diagram of block diagram of a repetitive turbo decoder with bit insertion.

Referring to FIGS. 5 through 8, and particularly the turbo decoder of FIGS. 7, the encoder outputs uk, e1k and e2k are received by the turbo decoder over the noisy channel as respective systematic decoder input xk, first coded decoder input y1k and second coded decoder input y2k, which are fed into the bit insertion providing the Xk, Y1k, and Y2k sequences each of length rN+m. The bit insertion function is an inverse function of the selected puncture pattern. The bit insertion corresponding to the puncture deleting the replicated systematic bits ru is to duplicate the received symbols in the systematic fragment, while the bit insertion corresponding to the puncture deleting the systematic tail bits u*, if any though not suggested, and coded bits e1(ru);e1* and e2(ru;u*) is to insert the dummy signal, zero value, at the proper positions. The resulting sequences Xk, Y1k, and Y2k strings retain their original lengths rN+m used in the encoder for processing by the first and second APP decoders. The turbo decoder may also operate at an r-times faster clock rate. The X deinterleaver provides an inverse function of the encoder systematic interleaver, when used. Likewise, the Y1 deinterleaver provides an inverse function of the first encoder interleaver when used. After bit insertion and Y1 and X deinterleaving, when used, the systematic input Xk and the first coded input Y1k are fed into the first a-posteriori probability (APP) decoder. The lengths of these inputs are rN+m. The X delay, Y1 delay, Y2 first delay and Y2 second delay provide synchronism of the three sequences Y1k, Y2k and Xk at inputs to the first and second APP decoder. An initial estimate of bias information indicated by an initialization switch is also fed into the first APP decoder. The first APP decoder provides the bias estimate that is fed into a first decoder interleaver providing a first decoder interleaver output, as the systematic decoder input Xk is concurrently fed into a second decoder interleaver providing a second decoder interleaved output. The second coded input Y2k is fed into a second modified a-posteriori probability (APP) decoder. A Y2 delay provides for time synchronism. These interleaving and deinterleaving patterns need to be properly designed so that all inputs to the first or second decoder are in the same respective order P1 and P2 as used in the respective first and second constituent encoders. Initially, the initialization switch is set to zero indicating that the first APP decoder will use initial bias estimates of the received bits a 50/50 middle bias point of being a zero or a one. The channel information defines, for example, the shape of a noise probability density function of a typical receiver demodulator. The second modified APP decoder receives the first and second decoder interleaver outputs as well as the second coded decoder input Y2k, all three of which are in interleaved order used by the second constituent encoder. The second APP decoder provides two outputs, one being systematic data bits estimates and the other being updated bias information. The data bit estimates are soft data bit estimates. The data bit estimates are deinterleaved by an output deinterleaver into the order of uninterleaved encoder systematic sequence ru;u* as the updated bias information is deinterleaved by a feedback deinterleaver into the order of P1 used by the first constituent encoder. In the case that the second constituent encoder is also flushed to the all-zero state, either the conventional or modified second APP decoder can be used. The data bit estimates and bias information outputs are generated and deinterleaved once for each iteration of the turbo decoding process. The data bit estimates are then fed through a hard limiter that translates the soft data bit estimates into zero and one hard data bit values, for each iteration. The hard bit values, for each iteration, for each duplicated bit, are then stored in a majority selection. At the end of the turbo decoding iterations, the majority selection selects either a zero or a one, for each repetitive systematic data bit, depending on the number of one and zero vote occurrences acquired during the iterations. At the end of the interaction, the second majority selection starts to select either a zero or a one for each decoded bit by major vote among r replicated bits, depending on the number of one and zero vote occurrences among all r duplicated bits, thereby deleting repetitive bits as an inverse function of the bit partitioning repetition. In the event of a tie vote occurrences, the major vote of the last iteration is selected or simply select either a one or a zero. The majority selection provides the decoder output of a block of N systematic data bits Dk.

Figure 8:
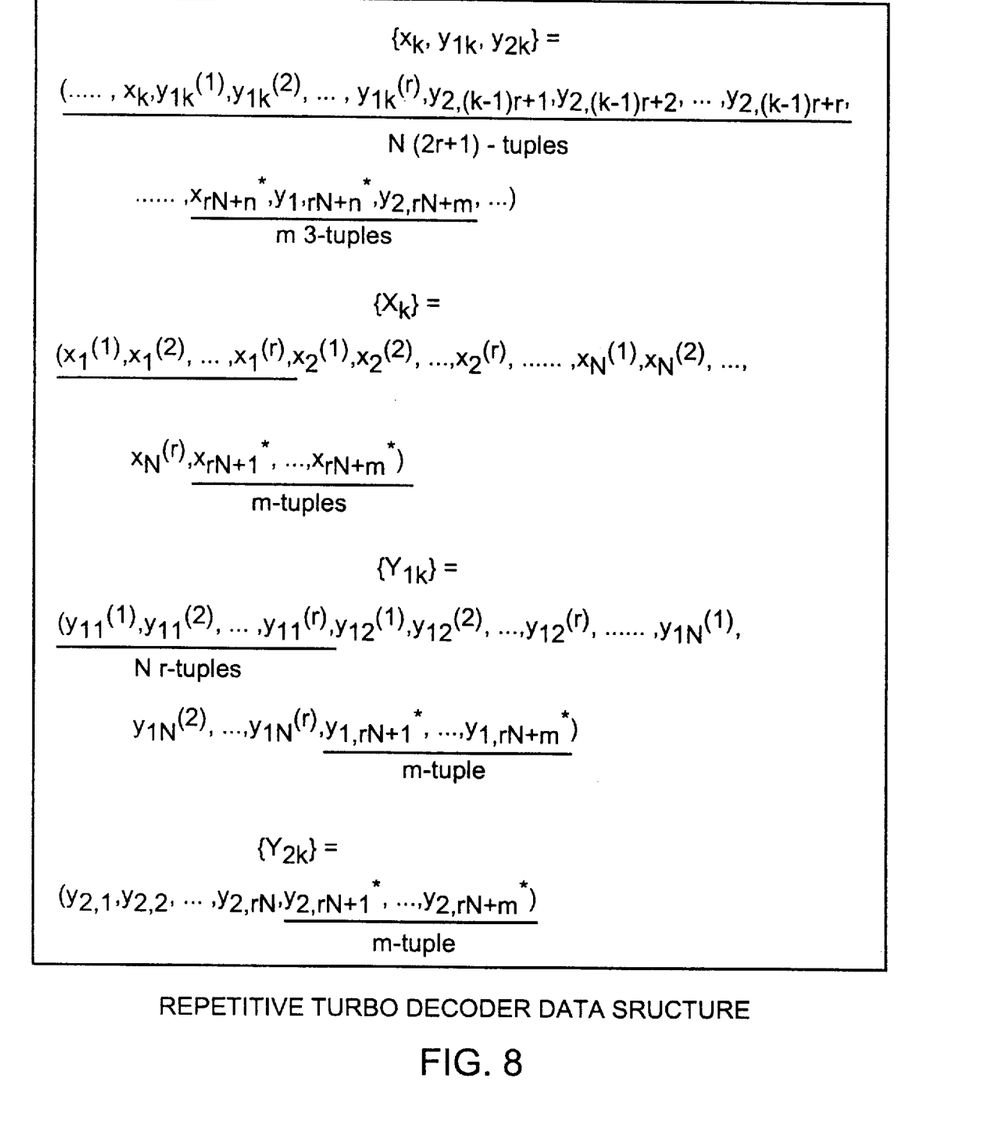
FIG. 8 is a diagram of a repetitive turbo decoder data structure.

Referring to FIG. 8, as an inverse operation on the data structure given by FIG. 6, after the receipt of {xk, y1k, y2k}, the repetitive turbo decoder first repeats the systematic bits xk by r times and then feeds the resulting sequences to a conventional turbo decoder. The decoding algorithm preferably provides bit insertion to provide an inverse function of the puncture pattern. Majority selection bit also provides voting bit deletion as an inverse function of the bit partitioning function. The bit insertion function may be simple duplication of the received symbols in the systematic fragment or the insertion of zero bit value signal at the deleted positions of the codeword, feeding the resulting sequences into a conventional nonrepetitive turbo decoder at a clock rate of r time faster. After the decoding, a majority selection function is used for final decision as to whether a bit is declared to be a zero or a one, and for the bit deletion function.

It should now become apparent that the repetitive turbo encoder decoder system can have a variety of configurations, so long as the systematic sequence is repeated and enters into a rN or rN+m sized encoder interleaver providing an interleaved input to a respective one of the constituent encoders. A first exemplar configuration is where Xk has an input systematic symbol length of N+m with r repetition and 1/r puncturing with 1/r bit insertion, where Y1k has a input code symbol length of rN+m with r repetition, and where Y2k has an arbitrary input code symbol length with input encoder interleaving, and puncturing, and decoder bit insertion and deinterleaving, so that three rN+m sizes repetitive sequences are processed in the decoder with a majority selection bit deletion. A second exemplar configuration is where Xk has an input systematic symbol length of N+m with r repetition and 1/r puncturing with 1/r bit insertion, where Y1k has a input code symbol length of rN+m with encoder interleaving and decoder deinterleaving, and Y2k has an arbitrary input code symbol length with input encoder interleaving, puncturing, and decoder bit insertion and deinterleaving, so that M three rN+m sized repetitive sequences are processed in the decoder with majority selection bit deletion. A third exemplar configuration is where Xk has an input systematic symbol length of N+m with r repetition and 1/r puncturing and bit insertion, where Y1k has an arbitrary input code symbol length with input encoder interleaving and puncturing, and decoder bit insertion and deinterleaving, and where Y2k has an arbitrary input code symbol length with input encoder interleaving, puncturing and bit insertion and decoder deinterleaving, so that three rN+m sized repetitive sequences are processed in the decoder with majority selection bit deletion. There are of course, many possible configurations. For example, the decoder received sequence xk, y1, and y2 need not necessarily have the same transmitted symbol length, and the x and y1 sequences need not be encoder interleaved and decoder deinterleaved. What is required is that at least one of the constituent encoder sequences have an interleaved repetitive input, for example P2(ru). Generally, it is necessary that one encoder sequence Y1 or Y2 be repetitive and interleaved prior to encoding, and it is preferred that the decoder operate on rN+m bits as a repetitive decoder.

The repetitive turbo coding system comprising the repetitive turbo encoder and decoder can also operate as an error-floor mitigating turbo coding system, by not flushing the second encoder to the all zero state and using the modified second APP decoder. In such cases, the turbo coding system has coding gain contribution from both the interleaved repetitive second encoding and the nonflushing of the second encoder using the modified second APP decoder for forward recursions ending and the backward recursion beginning at any state. When the interleaved flushing m tail bits to the second encoder do not set the second encoder to the zero state at the end of the entire systematic sequence, then a modified APP second encoder can be used for improved coding gain. Also, where multiple encoder interleavers are used, such as both the first and second encoder interleaver, the first and second decoder interleaver functions need to be formed as hybrid interleavers so as to correspond to the dual interleaver configuration. Those skilled in the art of turbo coding can configure hybrid decoder interleavers for proper decoding when using multiple encoder interleavers.

For repetition of a rate r=2, the majority selection does not provide a coding gain and the BER performance will be degraded due to the decrease of the code rate. However, for a repetition rate of r=3, the analytical BER is given by Pb=pE3+3pE2(1-p) where p is computed from the Pb summation equation with Es being Eb/7. The BER for a repetition rate of r=3 can be examined for optimizing the code structure. The following simulated PERFORMANCE TABLE lists the best repetitive code for r=3 and for K=3, K=4, and K=5. The values of Pb are evaluated for the transfer function bound with an Eb/N0=8 dB and a block size of 250.

| REPETITIVE CODE PERFORMANCE TABLE | | |
|---|---|---|
| g0 | g1 | Pb |
| K = 3 | | |
| 111 | 101 | 4.31E-13 |
| 101 | 111 | 2.91E-11 |
| 111 | 110 | 4.06E-10 |
| 111 | 100 | 4.50E-10 |
| 101 | 110 | 3.04E-09 |
| 110 | 111 | 3.58E-09 |
| 101 | 100 | 1.29E-07 |
| K = 4 | | |
| 1011 | 1111 | 1.19E-15 |
| 1101 | 1111 | 1.19E-15 |
| 1011 | 1101 | 5.57E-15 |
| 1101 | 1011 | 5.57E-15 |
| 1011 | 1001 | 2.49E-14 |
| 1101 | 1001 | 2.49E-14 |
| 1111 | 1011 | 1.73E-13 |
| 1111 | 1101 | 1.73E-13 |
| 1001 | 1111 | 1.75E-13 |
| 1111 | 1001 | 1.98E-13 |
| K = 5 | | |
| 10011 | 11101 | 1.77E-17 |
| 11001 | 10111 | 1.77E-17 |
| 10011 | 11011 | 2.20E-17 |
| 11001 | 11011 | 2.20E-17 |
| 10011 | 11111 | 3.05E-17 |
| 11001 | 11111 | 3.05E-17 |
| 10111 | 11101 | 7.24E-17 |
| 11101 | 10111 | 1.24E-17 |
| 11111 | 10101 | 8.15E-17 |
| 10111 | 10001 | 9.48E-17 |

The BER performance of the codes listed in the BER PERFORMANCE TABLE with repetition rate of r=3 are compared to using a block size of 500. The repetitive turbo code with a repetition rate of r=3 can approximately achieve an additional 1 dB of coding gain asymptotically for a constraint length of K=5 with a block size of N=500. BER performances can be compared against prior preferred nonrepetitive turbo codes of the same rates by using low rate constituent encoder. For constraint lengths of K=4 and K=5, the repetitive turbo code with a repetition rate of r=3 and resulting code rate of 1/7 can improve the BER by two orders of magnitude over those using a code rate of 1/4 constituent code with a block size of 1000. The smaller the block size, the less significant the improvement. The analytical BER bounds for repetitive turbo codes of constraint lengths of K=3, K=4, and K=5 show the improved performance over the nonrepetitive turbo code. Because the analytical BER bound at high Eb/N0 can be used as the asymptotic BER performance of the turbo code and as a referencing location of the error floor, this means that the error floor of the turbo code can be further reduced by adopting a repetitive structure.

It should be apparent, the repetitive turbo coding system and method can function in a variety of configurations and can be combined and enhanced with mitigated turbo coding. Those skilled in the art can make enhancements, improvements and modifications to enhance the invention. However, those enhancements, improvements and modifications may nonetheless fall within the spirit and scope of the following claims.

What is claimed:

1. A method for communicating systematic data bits using a prior bias information over a channel, the method comprising the steps of, generating an input block of data bits as the systematic data bits, repeating r time the systematic data bits as a repetitive systematic sequence, generating systematic tail bits, appending the systematic tail bits to the repetitive systematic sequence providing a systematic string, first data bit encoding the repetitive systematic sequence into first code bits, first tail bit encoding the systematic tail bits into first parity check tail bits, the first encoding step transits between defined states ending in an all zero state, appending the first parity check tail bits to the first code bits providing a first code string, second encoder interleaving the systematic string providing a second encoder interleaved string, second encoding the second encoder interleaved string into a second code string in interleaved order, the second code string, the first code string and the systematic string have equal length, the second encoding step transits between defined states not ending in an all zero state, transmitting the systematic string, the first code string and the second code string throughout the channel, receiving the second code string, the first code string, and the systematic string, first decoding the systematic string using the first code string and using the a priori bias information as bias information as a first a posteriori probability bias estimation providing a bias estimate, first decoder interleaving the bias estimate into an interleaved bias string, second decoder interleaving the systematic string into a decoder interleaved string, second decoding the decoder interleaved string using the interleaved bias string and the second code string providing interleaved updated bias information and interleaved data bit estimates, feed back deinterleaving the interleaved updated bias information into updated bias information, feeding back the updated bias information as the a-priori bias information for first decoding step, output deinterleaving the interleaved data bit estimates into data bit estimates, hard limiting the data bit estimates into values of zero and one, repeating the first decoding, first decoding interleaving second decoding interleaving, second decoding, feed back deinterleaving, feeding back, output deinterleaving and hard limiting steps a plurality of iterations for generating a repetitive output block of values as an estimate of the repetitive systematic sequence, and bit deleting 1/r times the repetitive output block of values into an output block of values as an estimate of the input block of data bits.

2. The method of claim 1 further comprising the steps of majority selecting the output block of values for each of the data bits based on occurrences of zero or one values generated during the plurality of iterations to generate an output block of data bits as an estimate of the input block of data bits.

3. The method of claim 1 further comprising the steps of, puncturing the second code string prior to transmission, bit inserting the second code string after transmission, the bit inserting function is an inverse function of the puncturing step.

* * * * *